(12) United States Patent
Lee et al.

(10) Patent No.: US 8,072,070 B2
(45) Date of Patent: Dec. 6, 2011

(54) LOW FABRICATION COST, FINE PITCH AND HIGH RELIABILITY SOLDER BUMP

(75) Inventors: Jin-Yuan Lee, Hsin-Chu (TW); Mou-Shiung Lin, Hsin-Chu (TW); Ching-Cheng Huang, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

(21) Appl. No.: 12/493,258

(22) Filed: Jun. 29, 2009

(65) Prior Publication Data

US 2009/0261473 A1  Oct. 22, 2009

Related U.S. Application Data (60) Continuation of application No. 11/930,998, filed on Oct. 31, 2007, now Pat. No. 7,863,739, which is a continuation of application No. 10/935,451, filed on Sep. 7, 2004, which is a division of application No. 09/798,654, filed on Mar. 5, 2001, now Pat. No. 6,818,545.

(51) Int. Cl.
*H01L 23/48* (2006.01)
*H01L 23/52* (2006.01)
*H01L 29/40* (2006.01)
*H01L 23/053* (2006.01)
*H01L 23/12* (2006.01)
*H01L 27/10* (2006.01)
*H01L 29/74* (2006.01)

(52) U.S. Cl. ........ 257/737; 257/211; 257/700; 257/738; 257/758; 257/759; 257/760; 257/E21.575; 257/E21.576; 257/E21.577; 257/E21.58; 257/E21.582; 257/E21.583; 257/E21.584; 257/E21.585; 257/E21.586; 257/E21.589; 257/E21.59; 257/E21.627; 257/E21.641

(58) Field of Classification Search .................. 257/211, 257/700, 758–760, E21.575, E21.576, E21.577, 257/E21.58, E21.582, E21.583, E21.584, 257/E21.585, E21.586, E21.589, E21.59, 257/E21.627, 737, 738
See application file for complete search history.

(56) References Cited

U.S. PATENT DOCUMENTS 3,821,785 A   6/1974   Rose
(Continued)

FOREIGN PATENT DOCUMENTS

EP   1005082   5/2000
(Continued)

OTHER PUBLICATIONS

Notice of Reason for Rejection for Japan Patent Application No. 2006-200592 dated Dec. 4, 2008 with English Translation.
(Continued)

*Primary Examiner* — Ida M Soward
(74) *Attorney, Agent, or Firm* — McDermott Will & Emery LLP (57) ABSTRACT

A barrier layer is deposited over a layer of passivation including in an opening to a contact pad created in the layer of passivation. A column of three layers of metal is formed overlying the barrier layer and aligned with the contact pad and having a diameter that is about equal to the surface of the contact pad. The three metal layers of the column comprise, in succession when proceeding from the layer that is in contact with the barrier layer, a layer of pillar metal, a layer of under bump metal and a layer of solder metal. The layer of pillar metal is reduced in diameter, the barrier layer is selectively removed from the surface of the layer of passivation after which reflowing of the solder metal completes the solder bump of the invention.

23 Claims, 7 Drawing Sheets

U.S. PATENT DOCUMENTS

| | | | |
|---|---|---|---|
| 3,874,072 A | 4/1975 | Rose | |
| 4,087,314 A | 5/1978 | George | |
| 4,179,802 A | 12/1979 | Joshi | |
| 4,652,336 A | 3/1987 | Andrascek | |
| 4,950,623 A | 8/1990 | Dishon | |
| 5,011,580 A | 4/1991 | Pan et al. | |
| 5,046,161 A | 9/1991 | Takada | |
| 5,048,181 A | 9/1991 | Grider | |
| 5,061,985 A | 10/1991 | Meguro et al. | |
| 5,071,518 A | 12/1991 | Pan | |
| 5,075,965 A | 12/1991 | Carey et al. | |
| 5,083,187 A | 1/1992 | Lamson | |
| 5,106,461 A | 4/1992 | Volfson et al. | |
| 5,108,950 A | 4/1992 | Wakabayashi | |
| 5,132,775 A | 7/1992 | Brighton | |
| 5,134,460 A | 7/1992 | Brady et al. | |
| 5,137,845 A | 8/1992 | Lochon et al. | |
| 5,172,471 A | 12/1992 | Huang | |
| 5,223,454 A | 6/1993 | Uda et al. | |
| 5,225,711 A | 7/1993 | Chang et al. | |
| 5,226,232 A | 7/1993 | Boyd | |
| 5,244,833 A * | 9/1993 | Gansauge et al. | 216/13 |
| 5,251,806 A | 10/1993 | Agarwala et al. | |
| 5,252,781 A | 10/1993 | Shirai et al. | |
| 5,261,155 A | 11/1993 | Angulas | |
| 5,268,072 A | 12/1993 | Agarwala et al. | |
| 5,293,071 A | 3/1994 | Erdos | |
| 5,326,709 A | 7/1994 | Moon et al. | |
| 5,349,495 A | 9/1994 | Visel et al. | |
| 5,418,186 A | 5/1995 | Park | |
| 5,466,635 A | 11/1995 | Lynch et al. | |
| 5,496,770 A | 3/1996 | Park | |
| 5,503,286 A | 4/1996 | Nye, III et al. | |
| 5,508,561 A | 4/1996 | Tago et al. | |
| 5,523,920 A | 6/1996 | Machuga et al. | |
| 5,536,362 A | 7/1996 | Love et al. | |
| 5,541,135 A | 7/1996 | Pfeifer | |
| 5,554,887 A | 9/1996 | Sawai et al. | |
| 5,554,940 A | 9/1996 | Hubacher | |
| 5,565,379 A | 10/1996 | Baba | |
| 5,567,655 A | 10/1996 | Rostoker et al. | |
| 5,575,662 A | 11/1996 | Yamamoto et al. | |
| 5,587,623 A | 12/1996 | Jones | |
| 5,600,180 A | 2/1997 | Kusaka et al. | |
| 5,631,499 A | 5/1997 | Hosomi | |
| 5,633,535 A | 5/1997 | Chao et al. | |
| 5,641,946 A | 6/1997 | Shim | |
| 5,643,830 A | 7/1997 | Rostoker et al. | |
| 5,656,858 A * | 8/1997 | Kondo et al. | 257/737 |
| 5,656,863 A | 8/1997 | Yasunaga | |
| 5,664,642 A | 9/1997 | Williams | |
| 5,665,639 A | 9/1997 | Seppala et al. | |
| 5,736,791 A | 4/1998 | Fujiki et al. | |
| 5,741,726 A | 4/1998 | Barber | |
| 5,744,843 A | 4/1998 | Efland et al. | |
| 5,756,370 A | 5/1998 | Farnworth et al. | |
| 5,767,010 A | 6/1998 | Mis | |
| 5,773,897 A | 6/1998 | Wen et al. | |
| 5,790,377 A | 8/1998 | Schreiber et al. | |
| 5,795,818 A | 8/1998 | Marrs | |
| 5,796,169 A | 8/1998 | Dockerty et al. | |
| 5,821,626 A | 10/1998 | Ouchi et al. | |
| 5,844,782 A | 12/1998 | Fukasawa | |
| 5,847,936 A | 12/1998 | Forehand et al. | |
| 5,854,513 A | 12/1998 | Kim | |
| 5,870,822 A | 2/1999 | Drake et al. | |
| 5,872,399 A | 2/1999 | Lee | |
| 5,877,078 A | 3/1999 | Yanagida | |
| 5,882,957 A | 3/1999 | Lin | |
| 5,883,435 A | 3/1999 | Geffken | |
| 5,891,756 A | 4/1999 | Erickson | |
| 5,892,273 A | 4/1999 | Iwasaki | |
| 5,898,222 A | 4/1999 | Farooq | |
| 5,903,058 A | 5/1999 | Akram | |
| 5,903,343 A | 5/1999 | Ning et al. | |
| 5,907,790 A | 5/1999 | Kellam | |
| 5,931,371 A | 8/1999 | Pao et al. | |
| 5,937,320 A | 8/1999 | Andricacos et al. | |
| 5,943,597 A | 8/1999 | Kleffner | |
| 5,946,590 A | 8/1999 | Satoh | |
| 5,959,357 A * | 9/1999 | Korman | 257/758 |
| 5,977,632 A | 11/1999 | Beddingfield | |
| 5,985,765 A | 11/1999 | Hsiao et al. | |
| 5,986,339 A * | 11/1999 | Pai et al. | 257/700 |
| 6,013,571 A * | 1/2000 | Morrell | 438/612 |
| 6,015,505 A | 1/2000 | David et al. | |
| 6,028,363 A | 2/2000 | Lin | |
| 6,030,512 A | 2/2000 | Ihara et al. | |
| 6,042,953 A | 3/2000 | Yamaguchi | |
| 6,049,122 A | 4/2000 | Yoneda | |
| 6,051,450 A | 4/2000 | Ohsawa et al. | |
| 6,060,648 A | 5/2000 | Heath | |
| 6,060,683 A | 5/2000 | Estrada | |
| 6,075,290 A | 6/2000 | Schaefer et al. | |
| 6,077,726 A | 6/2000 | Mistry et al. | |
| 6,093,964 A | 7/2000 | Saitoh | |
| 6,103,552 A | 8/2000 | Lin | |
| 6,107,109 A | 8/2000 | Akram et al. | |
| 6,144,100 A | 11/2000 | Shen | |
| 6,144,102 A | 11/2000 | Amagai | |
| 6,160,715 A | 12/2000 | Degani et al. | |
| 6,162,652 A | 12/2000 | Dass et al. | |
| 6,169,329 B1 | 1/2001 | Farnworth et al. | |
| 6,180,265 B1 | 1/2001 | Erickson | |
| 6,181,010 B1 * | 1/2001 | Nozawa | 257/737 |
| 6,181,012 B1 | 1/2001 | Edelstein et al. | |
| 6,181,569 B1 | 1/2001 | Chakravorty | |
| 6,184,143 B1 * | 2/2001 | Ohashi et al. | 438/697 |
| 6,187,680 B1 | 2/2001 | Costrini | |
| 6,191,493 B1 | 2/2001 | Yasunaga et al. | |
| 6,194,309 B1 | 2/2001 | Jin | |
| 6,197,613 B1 | 3/2001 | Kung et al. | |
| 6,198,169 B1 * | 3/2001 | Kobayashi et al. | 257/780 |
| 6,198,619 B1 | 3/2001 | Fujioka | |
| 6,201,035 B1 | 3/2001 | Tuinman et al. | |
| 6,218,281 B1 * | 4/2001 | Watanabe et al. | 438/612 |
| 6,229,220 B1 | 5/2001 | Saitoh et al. | |
| 6,229,711 B1 | 5/2001 | Yoneda | |
| 6,250,541 B1 | 6/2001 | Shangguan | |
| 6,251,501 B1 | 6/2001 | Higdon et al. | |
| 6,271,107 B1 | 8/2001 | Massingill et al. | |
| 6,297,140 B1 | 10/2001 | Uzoh et al. | |
| 6,300,250 B1 * | 10/2001 | Tsai | 438/694 |
| 6,319,830 B1 | 11/2001 | Yamaguchi | |
| 6,329,605 B1 | 12/2001 | Beroz et al. | |
| 6,329,721 B1 | 12/2001 | DiGiacomo | |
| 6,332,988 B1 | 12/2001 | Berger, Jr. et al. | |
| 6,333,931 B1 | 12/2001 | LaPier et al. | |
| 6,348,728 B1 | 2/2002 | Aiba et al. | |
| 6,350,705 B1 * | 2/2002 | Lin | 438/779 |
| 6,362,087 B1 | 3/2002 | Wang et al. | |
| 6,372,619 B1 | 4/2002 | Huang et al. | |
| 6,372,622 B1 | 4/2002 | Tan | |
| 6,380,061 B1 | 4/2002 | Kobayashi | |
| 6,387,734 B1 | 5/2002 | Inaba et al. | |
| 6,396,155 B1 | 5/2002 | Nukiwa et al. | |
| 6,396,707 B1 | 5/2002 | Huang et al. | |
| 6,404,064 B1 | 6/2002 | Tsai et al. | |
| 6,406,967 B1 | 6/2002 | Chung et al. | |
| 6,426,281 B1 | 7/2002 | Lin et al. | |
| 6,426,556 B1 | 7/2002 | Lin | |
| 6,429,531 B1 | 8/2002 | Mistry | |
| 6,441,316 B1 | 8/2002 | Kusui | |
| 6,444,576 B1 | 9/2002 | Kong | |
| 6,448,504 B1 | 9/2002 | Taguchi | |
| 6,452,270 B1 | 9/2002 | Huang | |
| 6,467,674 B1 * | 10/2002 | Mihara | 228/164 |
| 6,475,896 B1 | 11/2002 | Hashimoto | |
| 6,476,501 B1 | 11/2002 | Ohuchi et al. | |
| 6,479,900 B1 | 11/2002 | Shinogi et al. | |
| 6,492,197 B1 | 12/2002 | Rinne | |
| 6,492,255 B2 * | 12/2002 | Enomoto et al. | 438/614 |
| 6,495,397 B2 | 12/2002 | Kubota | |
| 6,495,916 B1 * | 12/2002 | Ohuchi et al. | 257/737 |
| 6,501,169 B1 * | 12/2002 | Aoki et al. | 257/700 |
| 6,503,779 B2 | 1/2003 | Miyazaki | |
| 6,518,092 B2 * | 2/2003 | Kikuchi | 438/107 |

| | | | | | | |
|---|---|---|---|---|---|---|
| 6,518,651 | B2 | 2/2003 | Hashimoto | JP | 1061038 | 3/1989 |
| 6,548,898 | B2 | 4/2003 | Matsuki et al. | JP | 4278543 | 10/1992 |
| 6,551,861 | B1* | 4/2003 | Lin ............... 438/118 | JP | 4318935 | 11/1992 |
| 6,552,436 | B2 | 4/2003 | Burnette et al. | JP | 05-335313 | 12/1993 |
| 6,555,296 | B2 | 4/2003 | Jao et al. | JP | 06-037093 | 2/1994 |
| 6,555,459 | B1* | 4/2003 | Tokushige et al. ............. 438/612 | JP | 06333931 | 12/1994 |
| 6,573,598 | B2 | 6/2003 | Ohuchi | JP | 1961221 | 8/1995 |
| 6,578,754 | B1 | 6/2003 | Tung | JP | 1985660 | 10/1995 |
| 6,592,019 | B2 | 7/2003 | Tung | JP | 8013166 | 1/1996 |
| 6,600,234 | B2* | 7/2003 | Kuwabara et al. ............. 257/790 | JP | 2785338 | 8/1998 |
| 6,627,988 | B2* | 9/2003 | Andoh .......... 257/706 | JP | 10275811 | 10/1998 |
| 6,642,136 | B1 | 11/2003 | Lee et al. | JP | 11-163019 | 6/1999 |
| 6,646,286 | B1* | 11/2003 | Akram ........... 257/48 | JP | 11354578 | 12/1999 |
| 6,653,563 | B2 | 11/2003 | Bohr | JP | 2000106362 | 4/2000 |
| 6,656,758 | B1* | 12/2003 | Shinogi et al. .................. 438/33 | JP | 2000228420 | 8/2000 |
| 6,661,100 | B1 | 12/2003 | Anderson | JP | 2000228423 | 8/2000 |
| 6,683,380 | B2 | 1/2004 | Efland et al. | JP | 2000260803 | 9/2000 |
| 6,707,159 | B1 | 3/2004 | Kumamoto | JP | 2001-093928 | 4/2001 |
| 6,709,985 | B1 | 3/2004 | Goruganthu et al. | JP | 2001-257210 | 9/2001 |
| 6,731,003 | B2 | 5/2004 | Joshi | JP | 2002016096 | 1/2002 |
| 6,732,913 | B2 | 5/2004 | Alvarez | JP | 2002228420 | 8/2002 |
| 6,750,548 | B2* | 6/2004 | Farnworth .................... 257/779 | JP | 2003258014 | 9/2003 |
| 6,753,605 | B2 | 6/2004 | Joshi | JP | 2006128662 | 5/2006 |
| 6,762,122 | B2 | 7/2004 | Mis | JP | 2006147810 | 6/2006 |
| 6,798,050 | B1 | 9/2004 | Homma et al. | JP | 2006228420 | 8/2006 |
| 6,809,020 | B2 | 10/2004 | Sakurai | JP | 3829325 | 10/2006 |
| 6,815,324 | B2 | 11/2004 | Huang | JP | 3850261 | 11/2006 |
| 6,818,545 | B2 | 11/2004 | Lee et al. | JP | 3856304 | 12/2006 |
| 6,853,076 | B2 | 2/2005 | Datta | JP | 3856304 B | 12/2006 |
| 6,861,742 | B2 | 3/2005 | Miyamoto | JP | 2006333931 | 12/2006 |
| 6,864,165 | B1 | 3/2005 | Pogge | TW | 405195 | 9/2000 |
| 6,906,429 | B2 | 6/2005 | Tsubosaki | TW | 418470 | 1/2001 |
| 6,917,106 | B2 | 7/2005 | Datta | TW | 419765 | 1/2001 |
| 6,940,169 | B2 | 9/2005 | Jin | WO | WO0182375 | 11/2001 |
| 6,963,136 | B2 | 11/2005 | Shinozaki | | | |
| 6,977,435 | B2 | 12/2005 | Kim | | | |
| 6,998,710 | B2 | 2/2006 | Kobayashi | | | |
| 7,008,867 | B2 | 3/2006 | Lei | | | |
| 7,034,402 | B1 | 4/2006 | Seshan | | | |
| 7,064,435 | B2 | 6/2006 | Chung et al. | | | |
| 7,094,710 | B2* | 8/2006 | Mandal ........... 438/780 | | | |
| 7,098,127 | B2 | 8/2006 | Ito | | | |
| 7,112,889 | B1* | 9/2006 | Maruyama et al. ........... 257/797 | | | |
| 7,122,897 | B2 | 10/2006 | Aiba et al. | | | |
| 7,135,766 | B1 | 11/2006 | Costa | | | |
| 7,187,015 | B2* | 3/2007 | Tsau ............... 257/211 | | | |
| 7,196,001 | B2 | 3/2007 | Datta | | | |
| 7,205,249 | B2* | 4/2007 | Cheung et al. ................ 438/790 | | | |
| 7,208,834 | B2 | 4/2007 | Lee et al. | | | |
| 7,214,602 | B2* | 5/2007 | Marsh ........... 438/597 | | | |
| 7,220,657 | B2 | 5/2007 | Ihara | | | |
| 7,246,432 | B2 | 7/2007 | Tanaka | | | |
| 7,271,483 | B2 | 9/2007 | Lin et al. | | | |
| 7,335,536 | B2 | 2/2008 | Lange | | | |
| 7,355,288 | B2 | 4/2008 | Lee et al. | | | |
| 7,456,089 | B2 | 11/2008 | Aiba | | | |
| 7,462,942 | B2 | 12/2008 | Tan | | | |
| 7,479,690 | B2 | 1/2009 | Shiraishi | | | |
| 2001/0007373 | A1 | 7/2001 | Kadota et al. | | | |
| 2001/0008224 | A1 | 7/2001 | Woolsey et al. | | | |
| 2001/0039300 | A1 | 11/2001 | Suzuki et al. | | | |
| 2001/0040290 | A1 | 11/2001 | Sakurai | | | |
| 2002/0013010 | A1 | 1/2002 | Maruyama et al. | | | |
| 2002/0024053 | A1 | 2/2002 | Inoue et al. | | | |
| 2002/0033531 | A1 | 3/2002 | Matsushima et al. | | | |
| 2002/0043723 | A1 | 4/2002 | Shimizu | | | |
| 2002/0056741 | A1 | 5/2002 | Shieh et al. | | | |
| 2002/0098619 | A1 | 7/2002 | Ahn et al. | | | |
| 2003/0006062 | A1 | 1/2003 | Stone | | | |
| 2003/0218246 | A1 | 11/2003 | Abe | | | |
| 2004/0007779 | A1 | 1/2004 | Arbuthnot et al. | | | |
| 2004/0238955 | A1 | 12/2004 | Homma et al. | | | |
| 2005/0032349 | A1 | 2/2005 | Lee et al. | | | |
| 2006/0186519 | A1 | 8/2006 | Inoue et al. | | | |
| 2008/0258305 | A1 | 10/2008 | Lee et al. | | | |

FOREIGN PATENT DOCUMENTS

| | | |
|---|---|---|
| EP | 1536469 | 6/2005 |
| JP | 60217646 | 10/1985 |

OTHER PUBLICATIONS

Mistry, K. et at "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High vol. Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufaturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 06, 2004) pp. 1-3.

Lin, M.S. "Post Passivation Technology™—MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Lau, J. et al. "Chip Scale Package—Design Materials Process Reliability and Applications", Chapt 30, p. 467-475, McGraw-Hill Professional, 1999.

Ghandhi, S.K; "VLSI Fabrication Principles"; pp. 517-520; John Wiley & Sons.

Wolf, S. et al.; "Silicon Processing for the VLSI Era"; Lattice press, vol. 1, pp. 514-520.

English translation of the relevant portions of Interrogatory for Japanese application No. 2006-200592 dated Feb. 25, 2011.

* cited by examiner

LOW FABRICATION COST, FINE PITCH AND HIGH RELIABILITY SOLDER BUMP

This application is a continuation of application Ser. No. 11/930,998, filed on Oct. 31, 2007, now pending, which is a continuation of application Ser. No. 10/935,451, filed on Sep. 7, 2004, now pending, which is a division of application Ser. No. 09/798,654, filed on Mar. 5, 2001, now U.S. Pat. No. 6,818,545.

BACKGROUND OF THE INVENTION (1) Field of the Invention

The invention relates to the fabrication of integrated circuit devices, and more particularly, to a method of creating a reliable, fine pitch solder bump at low cost.

(2) Description of the Prior Art

Semiconductor device packaging has over the years received increased emphasis due to a continued decrease in semiconductor device feature size, a decrease that is driven by the dual requirements of improved device performance and reduced device manufacturing cost. This trend has led to a significant increase in semiconductor device density, which places increased emphasis on device or package I/O capabilities. The metal connections, which connect the Integrated Circuit to other circuits or to system components, have therefore become more important and can, with further miniaturization of the semiconductor device, have an increasingly negative impact on circuit performance. Increasing parasitic capacitance and resistance of the metal interconnections can significantly degrade chip performance. Of most concern in this respect is the voltage drop along the power and ground buses and the RC delay of the critical signal paths. Attempts to reduce the resistance by using wider metal lines result in higher capacitance of these wires.

One of the approaches that has been taken to solve these packaging problems is to develop low resistance metals (such as copper) for the interconnect wires, while low dielectric constant materials are being used in between signal lines. Another approach to solve problems of I/O capability has been to design chips and chip packaging techniques that offer dependable methods of increased interconnecting of chips at a reasonable manufacturing cost. This has led to the development of Flip Chip Packages.

Flip-chip technology fabricates bumps (typically Pb/Sn solders) on Al pads on the chips and interconnects the bumps directly to the package media, which are usually ceramic or plastic based. The flip-chip is bonded face down to the package medium through the shortest paths. These technologies can be applied not only to single-chip packaging, but also to higher or integrated levels of packaging in which the packages are larger, and to more sophisticated substrates that accommodate several chips to form larger functional units.

The flip-chip technique, using an array of I/O interconnects has the advantage of achieving the highest density of interconnection to the device combined with a very low inductance interconnection to the package. However, pre-testability, post-bonding visual inspection, and Coefficient of Thermal Expansion (CTE) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

Prior Art substrate packaging uses ceramic and plastic flip chip packaging. Ceramic substrate packaging is expensive and has proven to limit the performance of the overall package. Recent years has seen the emergence of plastic substrate flip chip packaging, this type of packaging has become the main stream design and is frequently used in high volume flip chip package fabrication. The plastic substrate flip chip package performs satisfactorily when used for low-density flip chip Integrated Circuits (IC's). If the number of pins emanating from the IC is high, that is in excess of 350 pins, or if the number of pins coming from the IC is less than 350 but the required overall package size is small, the plastic flip chip structure becomes complicated and expensive. This can be traced to the multi-layer structure used to create the plastic flip chip package. This multi-layer structure results in a line density within the package of typically 2-3 mil range. This line density is not sufficiently high for realizing the fan out from the chip I/O to the solder balls on the package within a single layer, leading to the multi-layer approach. The multi-layer approach brings with it the use of relatively thick (50 to 75 micrometers) dielectric layers, these layers have a Coefficient of Thermal Expansion (CTE) that is considerably higher than the CTE of the laminate board on which the plastic flip chip package is mounted. To counteract this difference in CTE's the overall package must be (thermally and mechanically) balanced resulting in the use of additional material and processing steps to apply these materials, increasing the cost of the Ball Grid Array (BGA) package and creating a yield detractor.

In creating semiconductor devices, the technology of interconnecting devices and device features is a continuing challenge in the era of sub-micron devices. Bond pads and solder bumps are frequently used for this purpose, whereby continuous effort is dedicated to creating bond pads and solder bumps that are simple, reliable and inexpensive.

Bond pads are generally used to wire device elements and to provide exposed contact regions of the die. These contact regions are suitable for wiring the die to components that are external to the die. An example is where a bond wire is attached to a bond pad of a semiconductor die at one end and to a portion of a Printed Circuit Board at the other end of the wire. The art is constantly striving to achieve improvements in the creation of bond pads that simplify the manufacturing process while enhancing bond pad reliability.

Materials that are typically used for bond pads include metallic materials, such as tungsten and aluminum, while heavily doped polysilicon can also be used for contacting material. The bond pad is formed on the top surface of the semiconductor device whereby the electrically conducting material is frequently embedded in an insulating layer of dielectric. In using polysilicon as the bond pad material, polysilicon can be doped with an n-type dopant for contacting N-regions while it can be doped with p-type dopant for contacting P-regions. This approach of doping avoids inter-diffusion of the dopants and dopant migration. It is clear that low contact resistance for the bond pad area is required while concerns of avoidance of moisture or chemical solvent absorption, thin film adhesion characteristics, delamination and cracking play an important part in the creation of bond pads.

The conventional processing sequence that is used to create an aluminum bond pad starts with a semiconductor surface, typically the surface of a silicon single crystalline substrate. A layer of Intra Metal Dielectric (IMD) is deposited over the surface, a layer of metal, typically aluminum, is deposited over the surface of the layer of IMD. The layer of metal is patterned and etched typically using a layer of photoresist and conventional methods of photolithography and etching. After a bond pad has been created in this manner, a layer of passivation is deposited over the layer of IMD. An opening that aligns with the bond pad is created in the layer of passivation, again using methods of photolithography and etching.

A conventional method that is used to create a solder bump over a contact pad is next highlighted. FIGS. 1 through 4 show an example of one of the methods that is used to create an interconnect bump. A semiconductor surface 10 has been provided with a metal contact pad 14, the semiconductor surface 10 is protected with a layer 12 of passivation. An opening 19 has been created in the layer 12 of passivation, the surface of the metal contact pad 14 is exposed through this opening 19. Next, FIG. 2, a dielectric layer 16 is deposited over the surface of the layer 12 of passivation. The layer 16 of dielectric is patterned and etched, creating an opening 21 in the layer 16 of dielectric that aligns with the metal pad 14 and that partially exposes the surface of the metal pad 14. A layer 18 of metal, typically using Under-Bump-Metallurgy (UBM), is created over the layer 16 of dielectric, layer 18 of metal is in contact with the surface of the metal pad 14 inside opening 21. The region of layer 18 of metal that is above the metal pad 14 will, at a later point in the processing, form a pedestal over which the interconnect bump will be formed. This pedestal can be further extended in a vertical direction by the deposition and patterning of one or more additional layers that may contain a photoresist or a dielectric material, these additional layers are not shown in FIG. 2. These layers essentially have the shape of layer 16 and are removed during one of the final processing steps that is applied for the formation of the interconnect bump.

A layer of photoresist (not shown) is deposited, patterned and etched, creating an opening that aligns with the contact pad 14. A layer 20 of metal, such as copper or nickel, FIG. 3, that forms an integral part of the pedestal of the to be created interconnect bump, is next electroplated in the opening created in the layer of photoresist and on the surface of the layer 18 of metal, whereby the layer 18 serves as the lower electrode during the plating process. Layer 20 in prior art applications has a thickness of between about 1 and 10 micrometers with a typical value of about 5 micrometers. The final layer 22 of solder is electroplated on the surface of layer 20. The patterned layer of photoresist is then removed.

Figure 1:
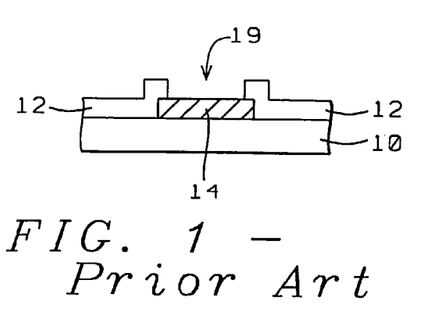
FIG. 1 shows a cross section of a semiconductor surface on the surface of which a contact pad has been created, the semiconductor surface is covered with a patterned layer of passivation.
Figure 2:
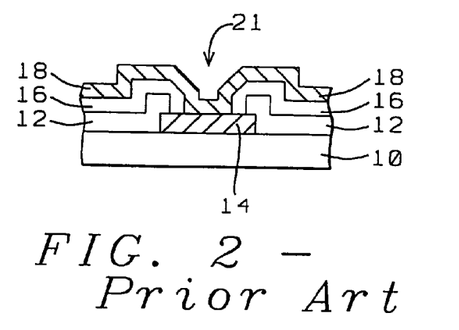
FIG. 2 shows the cross section of FIG. 1 after a patterned layer of dielectric and a layer of metal have been created on the semiconductor surface.
Figure 3:
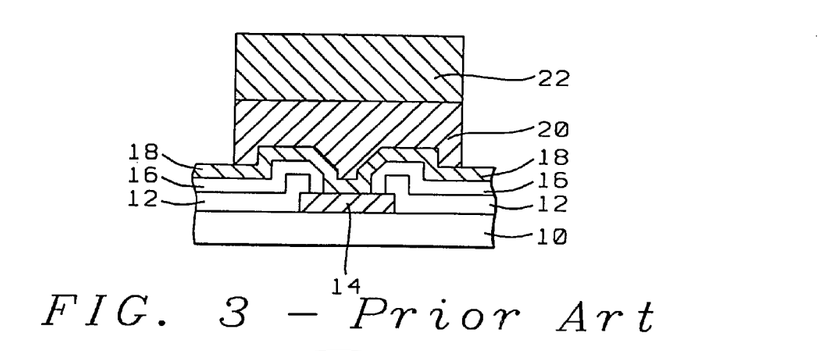
FIG. 3 shows a cross section of FIG. 2 after a layer of bump metal and solder compound have been selectively deposited.
Figure 4:
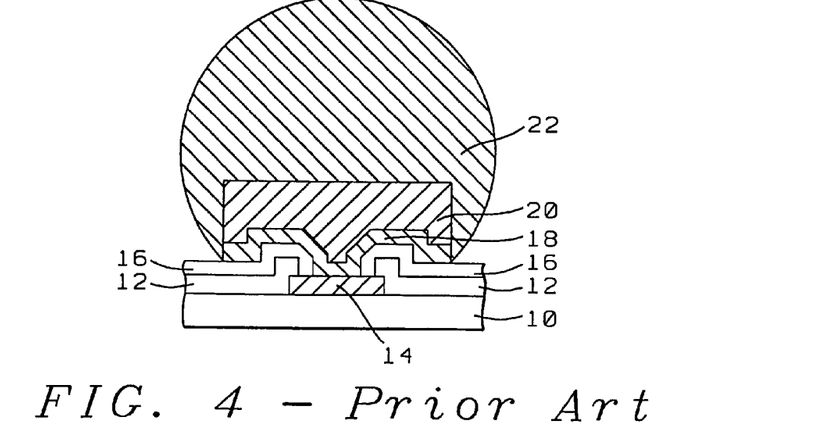
FIG. 4 show a cross section after excessive layers have been removed from the semiconductor surface and after the solder has been reflowed, forming the interconnect bump.

The layer 18 of metal is next etched, FIG. 4, leaving in place only the pedestal for the interconnect bump. During this etch process the deposited layers 20 and 22 serve as a mask. If, as indicated above, additional layers of dielectric or photoresist have been deposited for the further shaping of pedestal 18 in FIG. 2, these layers are also removed at this time.

A solder paste or flux (not shown) is now applied to the layer 22 of solder, the solder 22 is melted in a reflow surface typically under a nitrogen atmosphere, creating the spherically shaped interconnect bump 22 that is shown in FIG. 4.

In addition to the above indicated additional layers of dielectric or photoresist that can be used to further shape the pedestal of the interconnect bump, many of the applications that are aimed at creating interconnect bumps make use of layers of metal that serve as barrier layers or that have other specific purposes, such as the improvement of adhesion of the various overlying layers or the prevention of diffusion of materials between adjacent layers. These layers collectively form layer 18 of FIG. 4 and have, as is clear from the above, an effect on the shape of the completed bump and are therefore frequently referred to as Ball Limiting Metal (BLM) layer. Frequently used BLM layers are successive and overlying layers of chrome, copper and gold, whereby the chrome is used to enhance adhesion with an underlying aluminum contact pad, the copper layer serves to prevent diffusion of solder materials into underlying layers while the gold layer serves to prevent oxidation of the surface of the copper layer. The BLM layer is layer 18 of FIGS. 2 through 4.

Increased device density brings with it increased closeness of components and elements that are part of the created semiconductor devices. This increased closeness is expressed as a reduction in the spacing or "pitch" between elements of a semiconductor device. State-of-the-art technology uses solder bumps having a pitch of about 200 micrometers, which imposes a limitation on further increasing device density. The limitation in further reducing the pitch of solder bumps is imposed by concerns of reliability, which impose a relatively large ball size for the solder bump. This relatively large solder ball restricts further reducing the solder ball pitch.

In the majority of applications, solder bumps are used as interconnections between I/O bond pads and a substrate or printed circuit board. Large solder balls bring with it high standoff since a solder ball with high standoff has better thermal performance (CTE mismatching is easier to avoid resulting in reduced thermal stress on the solder balls). Large solder balls are therefore required in order to maintain interconnect reliability. Low-alpha solder is applied to avoid soft error (electrical or functional errors) from occurring, thereby eliminating the potential for inadvertent memory discharge and incorrect setting of the voltage (1 or 0).

U.S. Pat. No. 6,162,652 (Dass et al.) provides for the testing of an integrated circuit device including depositing a solder bump on a surface of a bond pad.

U.S. Pat. No. 5,756,370 (Farnworth et al.) provides a compliant contact system for making temporary connection with a semiconductor die for testing and a method for fabricating the pliable contact system.

U.S. Pat. No. 5,554,940 (Hubacker) addresses the probing of semiconductor devices that have been provided with contact bumps and the formation of peripheral test pads.

U.S. Pat. No. 5,665,639 (Seppala et al.), U.S. Pat. No. 6,051,450 (Ohsawa et al.) and U.S. Pat. No. 5,882,957 (Lin) show related bump processes.

U.S. Pat. No. 5,633,535 (Chao et al.) shows a pedestal process using dry resist.

U.S. Pat. No. 6,103,552 (Lin) provides a process and package for achieving wafer scale packaging, which includes formation of a solder bump.

SUMMARY OF THE INVENTION

A principal objective of the invention is to provide a method of creating a fine-pitch solder bump.

Another objective of the invention is to provide a method of creating smaller solder bumps, further allowing for the creation of fine-pitched solder bumps.

Another objective of the invention is to provide a cost-effective method to create a fine-pitch solder bump of high reliability, due to the increased height of the solder bump. This objective is based on the believe that solder bump reliability improves proportionally to the square of the distance between the solder ball and the underlying substrate.

Another objective of the invention is to provide a cost-effective way of creating a solder bump. This cost-effective way is realized by using standard solder material and therewith eliminating the need for expensive "low-.alpha. solder".

Another objective of the invention is to provide a cost-effective method of creating a fine-pitch solder bump by reducing the alpha-effect on memory products.

Another objective of the invention is to provide a method of creating solder bumps which allows an easy method of cleaning flux after the process of creating the solder bump has been completed.

Another objective of the invention is to provide a method of creating solder bumps which allows easy application of underfill.

In accordance with the process of the invention, a contact pad is formed on a semiconductor surface, overlying a layer of dielectric. A layer of passivation is deposited over the layer of dielectric for the protection of the contact pad, an opening is created in the layer of passivation that partially exposes the surface of the contact pad. A barrier layer is deposited over the layer of passivation including the opening created in the layer of passivation. A column of three layers of metal is formed overlying the barrier layer and aligned with the contact pad and having a diameter that is about equal to the surface of the contact pad. The three metal layers of the column comprise, in succession when proceeding from the layer that is in contact with the barrier layer, a layer of pillar metal, a layer of under bump metal and a layer of solder metal. The layer of pillar metal is reduced in diameter, the barrier layer is selectively removed from the surface of the layer of passivation after which reflowing of the solder metal completes the solder bump of the invention.

BRIEF DESCRIPTION OF THE DRAWINGS

FIGS. 1 through 4 show a prior art method of creating a solder bump overlying a point of electrical contact, as follows:

FIGS. 5 through 16 address the invention, as follows:

DESCRIPTION OF THE PREFERRED EMBODIMENTS

Figure 5:
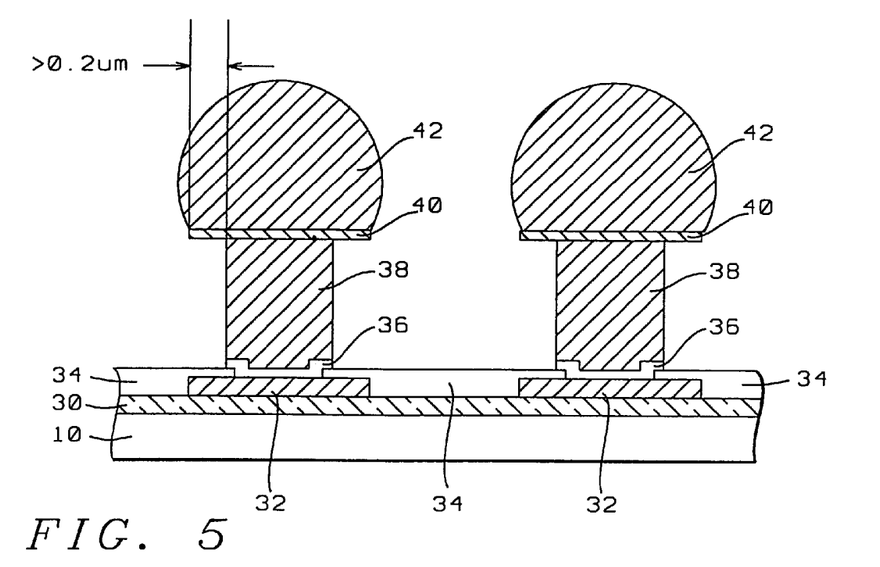
FIGS. 5 and 6 show a cross section of completed solder bumps of the invention.

Referring now specifically to FIG. 5, there is shown a cross section of completed solder bumps of the invention having a first profile. The term profile refers to the difference in which, during one of the final steps of the creation of the solder bumps, the layer of barrier metal is etched.

For the first profile of the solder bumps of the invention, an isotropic etch of the exposed barrier metal is performed, removing the exposed barrier metal except for where this barrier metal underlies the pillar metal of the invention.

For the second profile of the solder bumps of the invention, an anisotropic etch of the exposed barrier metal is performed, removing the exposed barrier metal except where the barrier metal is shielded from the anisotropic etch by the solder bump, prior to reflow of the solder bump.

Shown in cross section in FIG. 5 is the first profile of the solder bump of the invention, the elements of this solder bump are:

10, the semiconductor surface over which the solder bump is created, typically the surface of a silicon semiconductor substrate 30, a layer of dielectric that has been deposited over the semiconductor surface 10

32, contact pads that have been created on the surface of the layer 30 of dielectric 34, a patterned layer of passivation that has been deposited over the surface of the layer 30 of dielectric; openings have been created in the layer 34 of passivation, partially exposing the surface of contact pads 32

36, an isotropically etched layer of barrier metal; because this layer of barrier metal has been isotropically etched, the barrier metal has been completely removed from the surface of the layer 34 of passivation except where the barrier metal is covered by the overlying pillar metal (38) of the solder bump 38, the pillar metal of the solder bump 40, a layer of under bump metal created overlying the pillar metal 38 of the solder bump 42, the solder metal.

Figure 6:
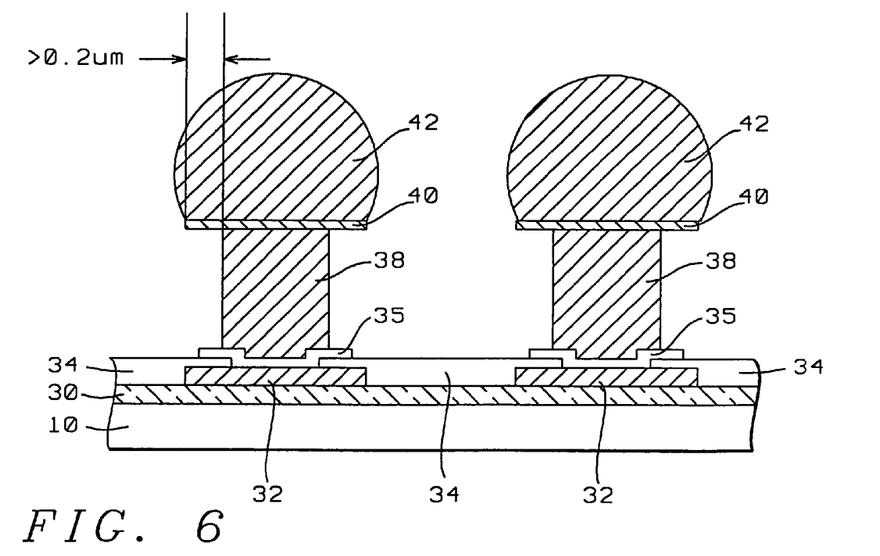

Shown in cross section in FIG. 6 is the second profile of the solder bump of the invention, the elements of this solder bump are the same as the elements that have been described above for the first profile of the solder bump of the invention with the exception of layer 35 which is an anisotropically etched layer of barrier metal which, due to the nature of the anisotropic etch, protrudes for the pillar metal 38 as shown in the cross section of FIG. 6.

FIGS. 7 through 16 provide detail of the process of the invention which leads to the solder bumps that have been shown in cross section in FIGS. 5 and 6.

Figure 7:
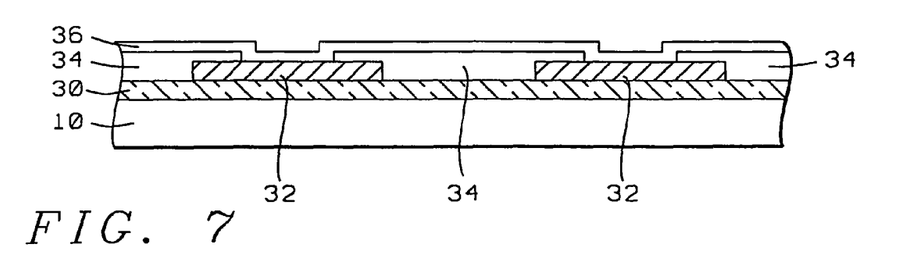
FIG. 7 shows a cross section of a semiconductor surface, a layer of dielectric has been deposited, metal pads have been created, a layer of passivation has been deposited and patterned, a layer of barrier material has been deposited.

FIG. 7 shows a cross section of substrate 10 on the surface, the following elements are highlighted:

10, a silicon substrate over the surface of which metal contact pads 32 have been created 30, a layer of dielectric that has been deposited over the surface of substrate 10

32, the metal contact pads, typically comprising aluminum, created over the surface of the layer 30 of dielectric 34, a layer of passivation that has been deposited over the surface of the layer 30 of dielectric. Openings have been created in the layer 34 of passivation that align with the metal contact pads 32, partially exposing the surface of the contact pads 32

36, a layer of barrier metal that has been created over the surface of layer 34 of passivation, including the openings that have been created in the layer 34 of passivation, contacting the underlying contact pads 32.

As dielectric material for layer 30 can be used any of the typically applied dielectrics such as silicon dioxide (doped or undoped), silicon oxynitride, parylene or polyimide, spin-on-glass, plasma oxide or LPCVD oxide. The material that is used for the deposition of layer 30 of dielectric of the invention is not limited to the materials indicated above but can include any of the commonly used dielectrics in the art.

The creation of metal contact pads 32 can use conventional methods of metal rf sputtering at a temperature between about 100 and 400 degrees C. and a pressure between about 1 and 100 mTorr using as source for instance aluminum-copper material (for the creation of aluminum contact pads) at a flow rate of between about 10 and 400 sccm to a thickness between about 4000 and 11000 Angstrom. After a layer of metal has been deposited, the layer must be patterned and etched to create the aluminum contact pads 32. This patterning and etching uses conventional methods of photolithography and patterning and etching. A deposited layer of AlCu can be etched using $Cl_2/Ar$ as an etchant at a temperature between 50 and 200 degrees C., an etchant flow rate of about 20 sccm for the $Cl_2$ and 1000 sccm for the Ar, a pressure between about 50 mTorr and 10 Torr, a time of the etch between 30 and 200 seconds.

In a typical application insulating layers, such as silicon oxide and oxygen-containing polymers, are deposited using Chemical Vapor Deposition (CVD) technique over the surface of various layers of conducting lines in a semiconductor device or substrate to separate the conductive interconnect lines from each other. The insulating layers can also deposited over patterned layers of interconnecting lines, electrical contact between successive layers of interconnecting lines is established with metal vias created in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited for further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent high quality passivation layer of polyimide over the substrate.

The preferred material of the invention for the deposition of layer 34 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 32 of PE $Si_3N_4$ can be deposited to a thickness between about 200 and 800 Angstrom.

Layer 34 of PE $Si_3N_4$ is next patterned and etched to create openings in the layer 34 that overlay and align with the underlying contact pads 32.

The etching of layer 34 of passivation can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 34 of passivation can also use $He/NF_3$ as an etchant at a temperature of between about 80 and 100 degrees C. and a pressure of between about 1.20 and 1.30 Torr for a time of between about 20 and 30 seconds using a dry etch process.

Barrier layers, such as layer 36, are typically used to prevent diffusion of an interconnect metal into surrounding layers of dielectric and silicon. Some of the considerations that apply in selecting a material for the barrier layer become apparent by using copper for interconnect metal as an example. Although copper has a relatively low cost and low resistivity, it has a relatively large diffusion coefficient into silicon dioxide and silicon and is therefore not typically used as an interconnect metal. Copper from an interconnect may diffuse into the silicon dioxide layer causing the dielectric to be conductive and decreasing the dielectric strength of the silicon dioxide layer. Copper interconnects should be encapsulated by at least one diffusion barrier to prevent diffusion into the silicon dioxide layer. Silicon nitride is a diffusion barrier to copper, but the prior art teaches that the interconnects should not lie on a silicon nitride layer because it has a high dielectric constant compared with silicon dioxide. The high dielectric constant causes a desired increase in capacitance between the interconnect and the substrate.

A typical diffusion barrier layer may contain silicon nitride, phosphosilicate glass (PSG), silicon oxynitride, aluminum, aluminum oxide ($Al_xO_y$), tantalum, Ti/TiN or Ti/W, nionbium, or molybdenum and is more preferably formed from TiN. The barrier layer can also be used to improve the adhesion of the subsequent overlying tungsten layer.

A barrier layer is preferably about 500 and 2000 angstrom thick and more preferably about 300 angstrom thick and can be deposited using rf sputtering.

After the creation of barrier layer 36, a seed layer (not shown in FIG. 7) can be blanket deposited over the surface of the wafer. For a seed layer that is blanket deposited over the surface of the wafer any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Figure 8:
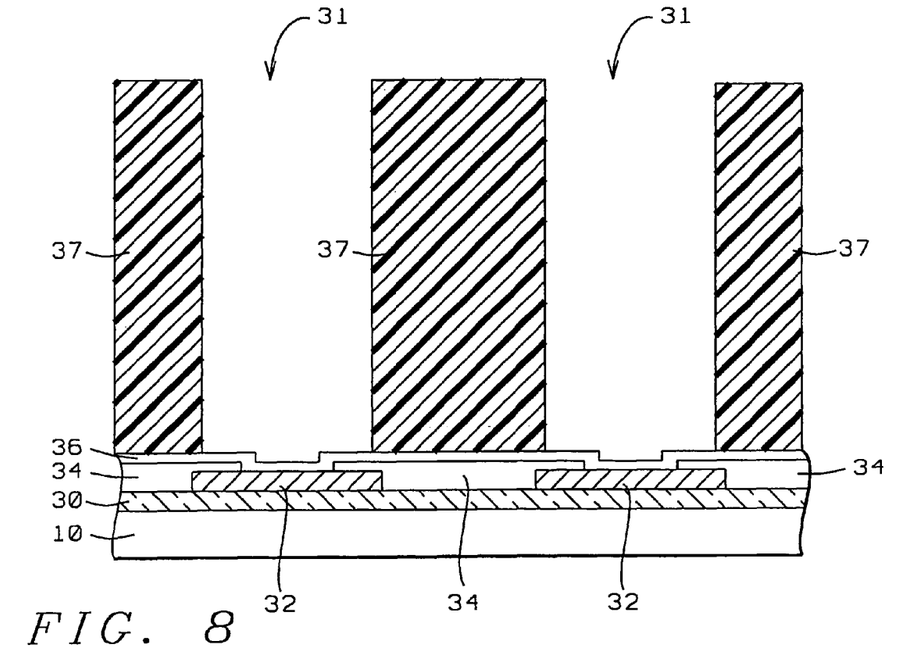
FIG. 8 shows a cross section after a patterned layer of photoresist has been created over the structure of FIG. 7.

FIG. 8 shows a cross section of the substrate after a layer 37 of photoresist has been deposited over the surface of the barrier layer 36. The layer 37 of photoresist has been patterned and etched, creating openings 31 in the layer 37 of photoresist. Openings 31 partially expose the surface of the barrier layer 36. Layer 37 of photoresist is typically applied to a thickness of between about 100 and 200 micrometers but more preferably to a thickness of about 150 micrometers.

Layer 37 of photoresist Layer 37 is typically applied to a thickness of between about 100 and 200 micrometers but more preferably to a thickness of about 150 micrometers. The methods used for the deposition and development of the layer 37 of photoresist uses conventional methods of photolithography. Photolithography is a common approach wherein patterned layers are formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered soluble (positive working) and washed away, or insoluble (negative working) and form the pattern.

The deposited layer 37 of photoresist can, prior to patterning and etching, be cured or pre-baked further hardening the surface of the layer 37 of photoresist.

Layer 37 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 37 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Figure 9:
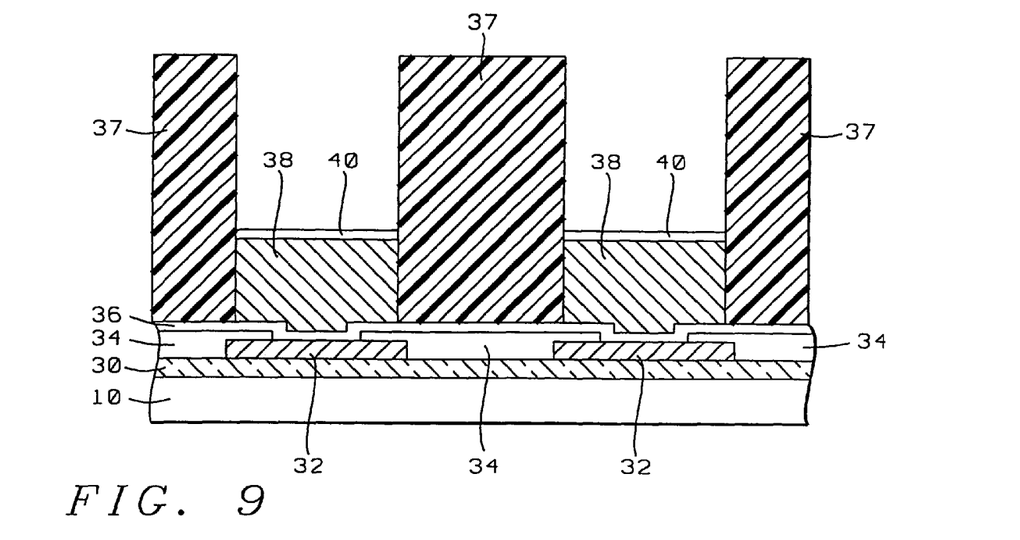
FIG. 9 shows a cross section after pillar metal has been created aligned with the metal pads, under bump metal has been deposited over the surface of the pillar metal.

FIG. 9 shows a cross section of the substrate 10 after a layer 38 of pillar metal has been deposited (electroplated) over the surface of the layer 36 of barrier material and bounded by openings 31 that have been created in the layer 37 of photoresist. Over the surface of the layers 38 of metal, which will be referred to as pillar metal in view of the role these layers play in the completed structure of the solder bumps of the invention, layers 40 of under bump metal have been deposited using deposition methods such as electroplating.

Layer 36 preferably comprises titanium or copper and is preferably deposited to a thickness of between about 500 and 2000 angstrom and more preferably to a thickness of about 1000 Angstrom.

Layer 38 preferably comprise copper and is preferred to be applied to a thickness of between about 10 and 100 micrometers but more preferably to a thickness of about 50 micrometers.

Layer 40 preferably comprises nickel and is preferred to be applied to a thickness of between about 1 and 10 micrometers but more preferably to a thickness of about 4 micrometers.

Figure 10:
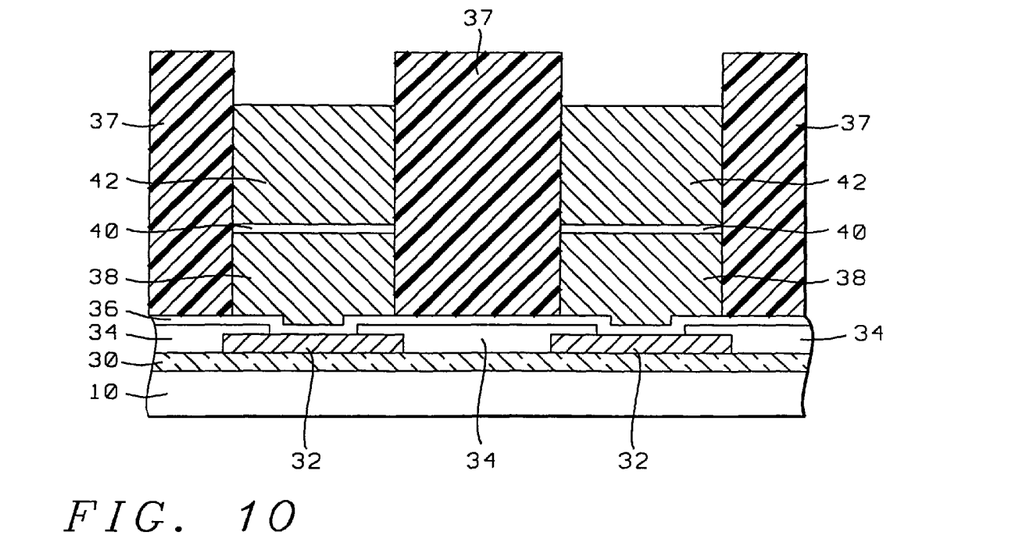
FIG. 10 shows a cross section after solder metal has been plated over the under bump metal.

FIG. 10 shows a cross section where the process of the invention has further electroplated layers 42 of solder metal over the surface of layers 40 of under bump metal (UBM) and bounded by the openings 31 that have been created in the layer 37 of photoresist.

Layer 40 of UBM, typically of nickel and of a thickness between about 1 and 10 micrometers, is electroplated over the layer 38 of pillar metal. The layer 42 of bump metal (typically solder) is electroplated in contact with the layer 40 of UBM to a thickness of between about 30 and 100 micrometers but more preferably to a thickness of about 50 micrometers. The layers 38, 40 and 42 of electroplated metal are centered in the opening 31 that has been created in the layer 37 of photoresist.

Figure 11:
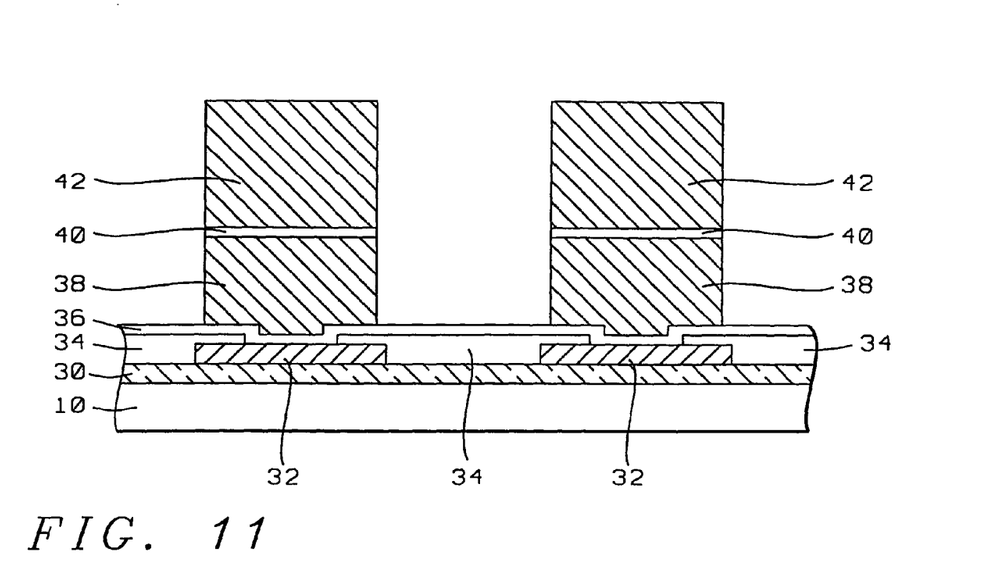
FIG. 11 shows a cross section after the patterned layer of photoresist has been removed from the surface.
Figure 12:
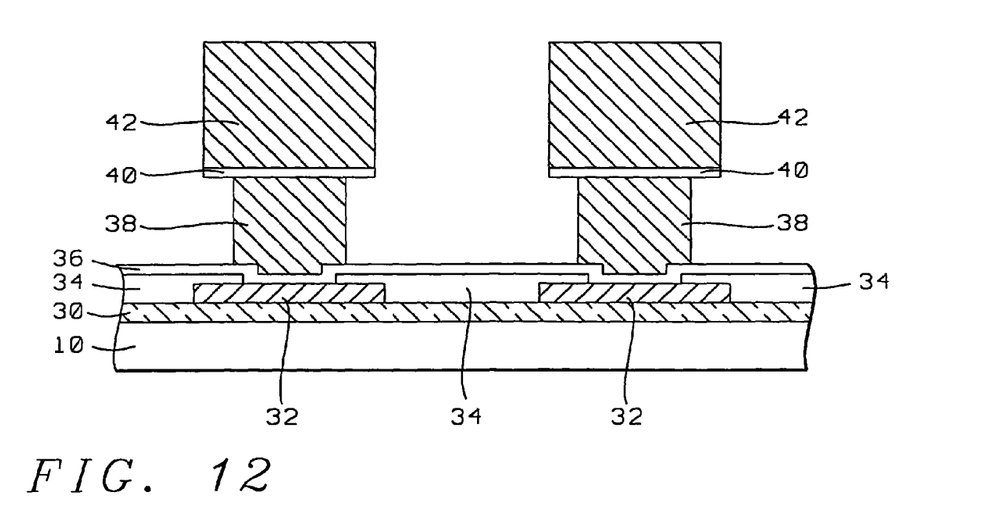
FIG. 12 shows a cross section after the diameter of the pillar metal has been reduced.

In the cross section that is shown in FIG. 11, it is shown that the patterned layer 37 of photoresist has been removed from above the surface of the barrier layer 36. The previously highlighted methods and processing conditions for the removal of a layer of photoresist can be applied for the purpose of the removal of layer 37 that is shown in cross section in FIG. 11. The invention further proceeds with the partial etching of the pillar metal 38, as shown in cross section in FIG. 12, using methods of wet chemical etching or an isotropic dry etch, selective to the pillar metal material. It is clear that, by adjusting the etching parameters, of which the time of etch is most beneficial, the diameter of the pillar metal 38 can be reduced by almost any desired amount. The limitation that is imposed on the extent to which the diameter of the pillar metal 38 is reduced is not imposed by the wet etching process but by concerns of metal bump reliability and functionality. Too small a remaining diameter of the pillar metal 38 will affect the robustness of the solder bumps while this may also have the affect of increasing the resistance of the metal bump.

Figure 13:
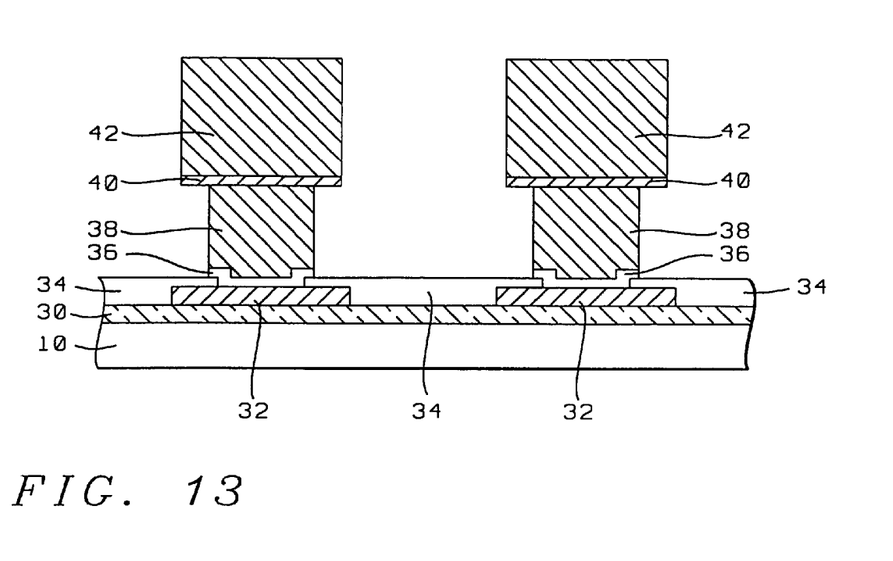
FIG. 13 shows a cross section after the barrier layer has been etched using isotropic etching, creating a first profile.
Figure 14:
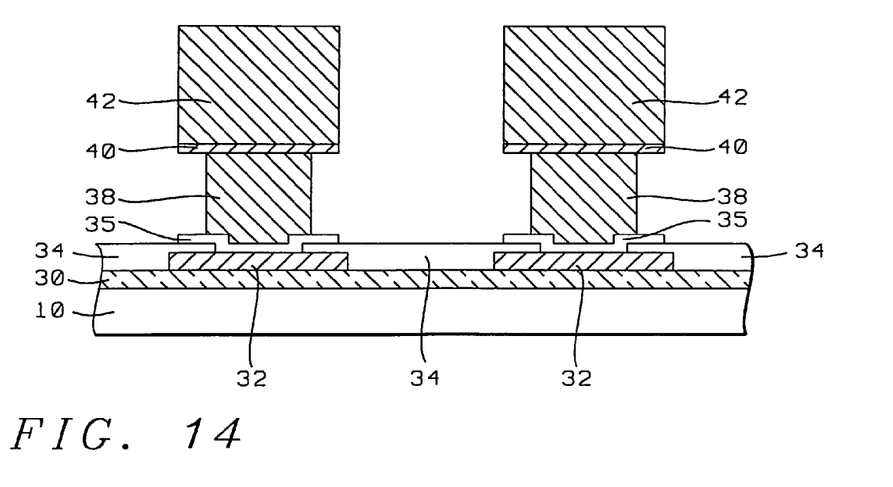
FIG. 14 shows a cross section after the barrier layer has been etched using anisotropic etching or RIE, creating a second profile.

The final two processing steps of the invention, before the solder metal is reflowed, are shown in the cross section of FIGS. 13 and 14 and affect the etching of the exposed surface of the barrier layer 36. Using isotropic etching, FIG. 13, the exposed barrier layer is completely removed as is shown in FIG. 13. Using anisotropic etching, FIG. 14, the etching of the barrier layer is partially impeded by the presence of the columns 42 of solder metal.

It is believed that the undercut shape of pillar 38 will prevent wetting of pillar 38 and the UBM layer 40 during subsequent solder reflow. It is also believed that exposure to air will oxidize the sidewalls of pillar 38 and UBM layer 40 and therefore prevent wetting of these surfaces during subsequent solder reflow. Optionally, the sidewalls of pillar 38 and UBM layer 40 may be further oxidized by, for example, a thermal oxidation below reflow temperature of about 240 degrees C. such as heating in oxygen ambient at about 125 degrees C.

Figure 15:
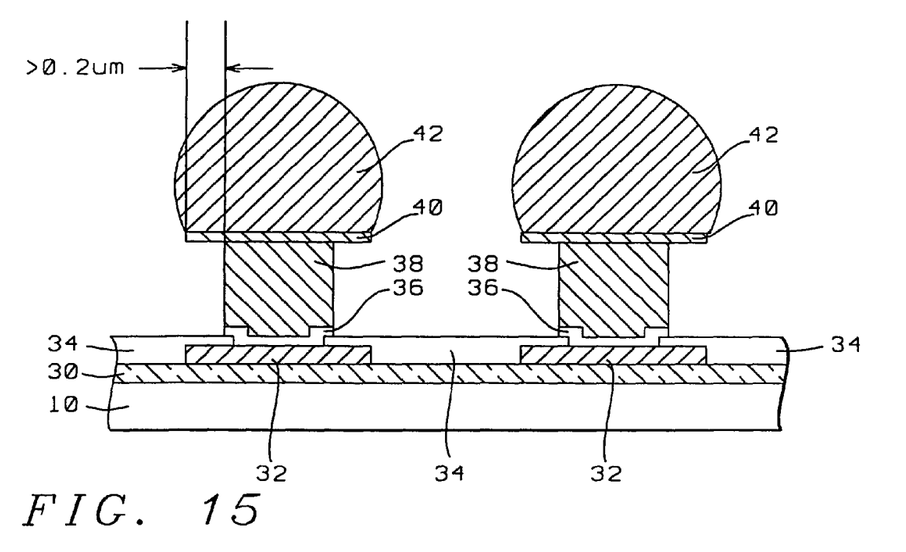
FIG. 15 shows a cross-section after the solder metal of the first profile has been reflowed.
Figure 16:
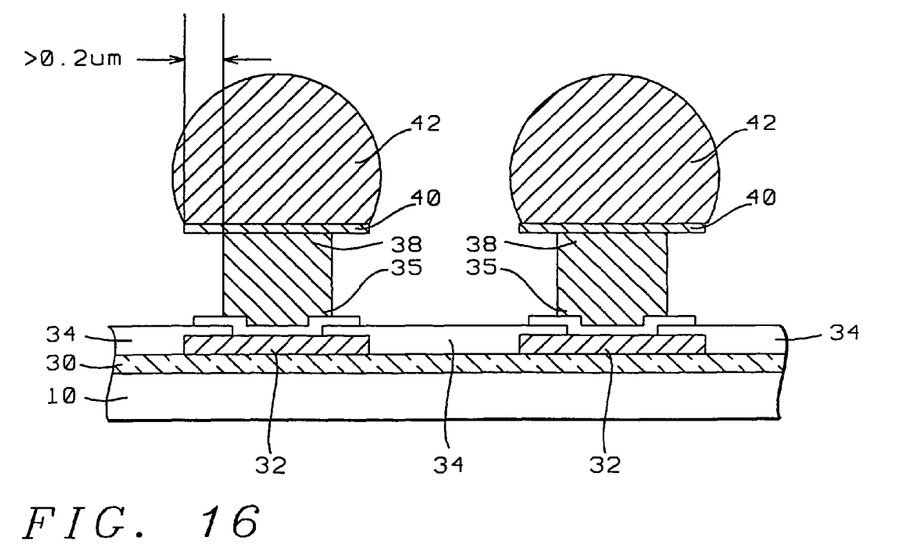
FIG. 16 shows a cross-section after the solder metal of the second profile has been reflowed.

FIGS. 15 and 16 show the final cross section of the solder bump of the invention after the solder metal has been reflowed. FIG. 15 corresponds to FIG. 13 while FIG. 16 corresponds to FIG. 14, this relating to the etch in the barrier layer 36 that has been explained using FIGS. 13 and 14. It is noted that the etched layer 36 of barrier material that is shown in cross section in FIG. 15 corresponds to the etched layer of barrier material that is shown in FIG. 13. The same correspondence exists between FIGS. 16 and 14.

The above summarized processing steps of electroplating that are used for the creation of a metal bump can be supplemented by the step of curing or pre-baking of the layer of photoresist after this layer has been deposited.

To review and summarize the invention:

prior to and in preparation for the invention, a semiconductor surface is provided, a layer of dielectric has been deposited over the semiconductor surface, a contact pad has been provided on the layer of dielectric, the contact pad has an exposed surface, a layer of passivation has been deposited over a semiconductor surface including the surface of said contact pad, the layer of passivation has been patterned and etched, creating an opening in the layer of passivation, partially exposing the surface of the contact pad, the opening in the layer of passivation is centered with respect to the contact pad the invention starts with a barrier layer deposited over the surface of the layer of passivation, making contact with the contact pad through the opening created in the layer of passivation a layer of photoresist is deposited over the surface of the barrier layer the layer of photoresist is patterned and etched, creating an opening through the layer of photoresist, the opening in the layer of photoresist aligns with and is centered with respect to the contact pad in sequence are deposited, bounded by the opening created in the layer of photoresist, a layer of pillar metal, a layer of under bump metal and a layer of solder metal the patterned layer of photoresist is removed from the surface of the barrier layer the layer of pillar metal is etched, reducing the diameter of the pillar metal the barrier layer is etched, using either isotropic or anisotropic etching the solder metal is reflowed.

The invention offers the following advantages:

ball height is a very important reliability concern; in order to prevent thermal mismatch between overlying layers of a package (such as a semiconductor device and an underlying printed circuit board and the like) it is important to increase the distance between overlying elements; the invention provides this ability a larger solder ball (for better thermal or reliability performance) results in increased pitch, this is contrary to state of the art design requirements if small solder balls are used without providing height, it is very difficult to underfill the small gaps the solder is, using the invention, relatively far removed from the semiconductor device which means that the application of low-alpha solder is not required (alpha-particles create soft errors in memory products, lead is known to emit alpha-particles when lead decays)

for the pillar metal a metal needs to be selected that has good conductivity and good ductility, such as copper. This is in order to provide improved thermal performance by counteracting thermal stress the height of the pillar of the solder bump of the invention is important and should be between about 10 to 100 micrometers in order to achieve objectives of high stand-off the metal that is used for the under bump metal layer is important in that this metal must have good adhesion with the overlying solder during solder reflow while this metal must not solve too fast and in so doing form a barrier to the solder; in addition, the UBM metal when exposed to air can form a layer of protective oxide thus preventing solder wetting to the pillar metal around the perimeter of the UBM metal during the reflow process; nickel is therefore preferred for the UBM metal Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A chip comprising:
    a silicon substrate;
    a dielectric layer over said silicon substrate;
    an aluminum pad over said dielectric layer;
    a topmost insulating layer of said chip over said dielectric layer, wherein an opening in said topmost insulating layer of said chip is over said aluminum pad, wherein said topmost insulating layer of said chip is a polymer layer; and
    a metal bump on said aluminum pad and on a first top surface of said topmost insulating layer of said chip, wherein said metal bump comprises a metal layer on said aluminum pad, in said opening and on said first top surface, a copper pillar on said metal layer, over said aluminum pad and over said first top surface, and a solder over said copper pillar, over said opening and over said first top surface, wherein said solder is connected to said copper pillar, wherein said copper pillar has a thickness between 10 and 100 micrometers, wherein said copper pillar has a second top surface higher than said first top surface and has a sidewall with a portion not covered by said solder.

2. The chip of claim 1, wherein said metal layer comprises titanium.

3. The chip of claim 1, wherein said metal layer comprises tantalum.

4. The chip of claim 1, wherein said metal layer has a thickness between 500 and 2,000 angstroms.

5. The chip of claim 1, wherein said metal bump further comprises a nickel-containing layer between said copper pillar and said solder.

6. The chip of claim 1, wherein said polymer layer of said topmost insulating layer of said chip comprises a polyimide layer.

7. The chip of claim 1 further comprising multiple layers of interconnecting lines, multiple additional insulating layers and multiple metal vias in said multiple additional insulating layers and between said multiple layers of interconnecting lines, wherein said multiple additional insulating layers comprise an oxide, wherein said multiple metal vias are connected to said multiple layers of interconnecting lines, and wherein said aluminum pad provides an electrical interface with said multiple layers of interconnecting lines.

8. The chip of claim 1, wherein said solder has a thickness between 30 and 100 micrometers.

9. The chip of claim 1, wherein said metal bump further comprises a nickel-containing layer between said copper pillar and said solder, wherein said nickel-containing layer has a thickness between 1 and 10 micrometers.

10. The chip of claim 1, wherein said solder has a portion overhanging said copper pillar.

11. The chip of claim 1, wherein said metal layer has a first portion vertically under said copper pillar and a second portion not vertically under said copper pillar.

12. A chip comprising:
- a silicon substrate;
- a dielectric layer over said silicon substrate;
- an aluminum pad over said dielectric layer;
- a topmost insulating layer of said chip over said dielectric layer, wherein an opening in said topmost insulating layer of said chip is over said aluminum pad, wherein said topmost insulating layer of said chip is a polymer layer; and
- a metal bump on said aluminum pad and on a first top surface of said topmost insulating layer of said chip, wherein said metal bump comprises a metal layer on said aluminum pad, in said opening and on said first top surface, and a copper pillar on said metal layer, over said aluminum pad and over said first top surface, wherein said copper pillar has a thickness between 10 and 100 micrometers and greater than a transverse dimension of said copper pillar, wherein said copper pillar has a second top surface higher than said first top surface.

13. The chip of claim 12, wherein said metal layer comprises titanium.

14. The chip of claim 12, wherein said metal layer comprises tantalum.

15. The chip of claim 12, wherein said metal layer has a thickness between 500 and 2,000 angstroms.

16. The chip of claim 12, wherein said metal bump further comprises an electroplated metal over said copper pillar, over said opening and over said first top surface.

17. The chip of claim 12, wherein said metal bump further comprises a nickel-containing layer on said copper pillar, over said opening and over said first top surface.

18. The chip of claim 12, wherein said metal bump further comprises a solder over said copper pillar, over said opening and over said first top surface.

19. The chip of claim 12, wherein said polymer layer of said topmost insulating layer of said chip is comprises a polyimide layer.

20. The chip of claim 12, wherein said metal bump further comprises a nickel-containing layer on said copper pillar, over said opening and over said first top surface, wherein said nickel-containing layer has a thickness between 1 and 10 micrometers.

21. The chip of claim 12, wherein said metal bump further comprises a solder over said copper pillar, over said opening and over said first top surface, wherein said solder has a thickness between 30 and 100 micrometers.

22. The chip of claim 12, wherein said metal bump further comprises a solder over said copper pillar, over said opening and over said first top surface, wherein said solder is connected to said copper pillar and has a portion overhanging said copper pillar.

23. The chip of claim 12, wherein said metal layer has a first portion vertically under said copper pillar and a second portion not vertically under said copper pillar.

* * * * *